(12) United States Patent
Hong et al.

(10) Patent No.: US 8,394,466 B2
(45) Date of Patent: Mar. 12, 2013

(54) METHOD OF FORMING CONFORMAL FILM HAVING SI-N BONDS ON HIGH-ASPECT RATIO PATTERN

(75) Inventors: Kuo-wei Hong, Tama (JP); Akira Shimizu, Sagamihara (JP); Kunitoshi Namba, Machida (JP); Woo-Jin Lee, Tama (JP)

(73) Assignee: ASM Japan K.K., Tokyo (JP)

( * ) Notice: Subject to any disclaimer, the term of this patent is extended or adjusted under 35 U.S.C. 154(b) by 251 days.

(21) Appl. No.: 12/875,889

(22) Filed: Sep. 3, 2010

(65) Prior Publication Data

US 2012/0058282 A1    Mar. 8, 2012

(51) Int. Cl.
*H05H 1/24*    (2006.01)
(52) U.S. Cl. ........................ 427/579; 427/569
(58) Field of Classification Search .................. 427/549, 427/569

See application file for complete search history.

(56) References Cited

U.S. PATENT DOCUMENTS

2006/0199357 A1*  9/2006  Wan et al. ..................... 438/482
2008/0242116 A1* 10/2008  Clark ........................... 438/791

* cited by examiner

*Primary Examiner* — Kelly M Gambetta
(74) *Attorney, Agent, or Firm* — Snell & Wilmer L.L.P.

(57) ABSTRACT

A method of forming a conformal dielectric film having Si—N bonds on a substrate having a patterned surface includes: introducing a reactant gas into a reaction space; introducing a silicon precursor in pulses of less than 5-second duration into the reaction space; applying a first RF power to the reaction space during the pulse of the silicon precursor; applying a second RF power to the reaction space during the interval of the silicon precursor pulse, wherein an average intensity of the second RF power during the interval of the silicon precursor pulse is greater than that of the first RF power during the pulse of the silicon precursor; and repeating the cycle to form a conformal dielectric film having Si—N bonds with a desired thickness on the patterned surface of the substrate.

19 Claims, 6 Drawing Sheets

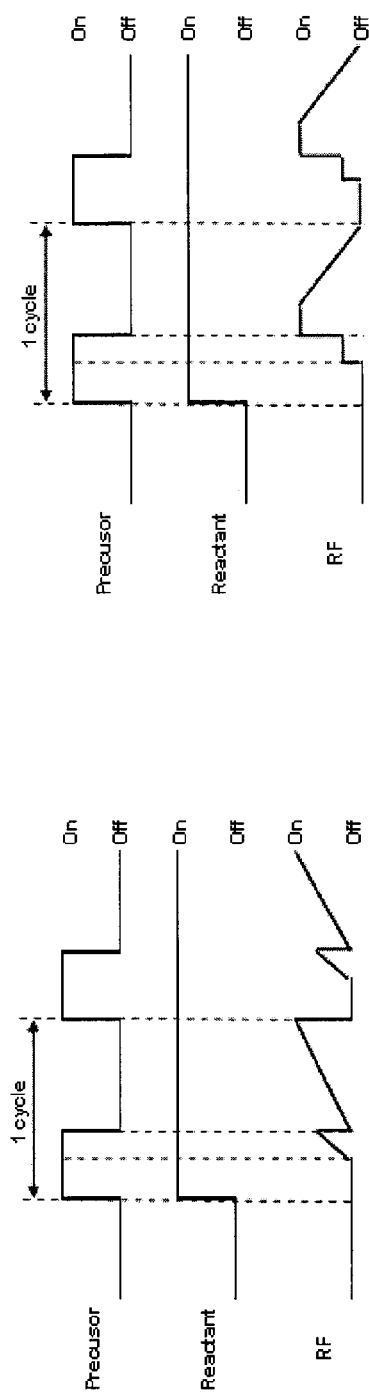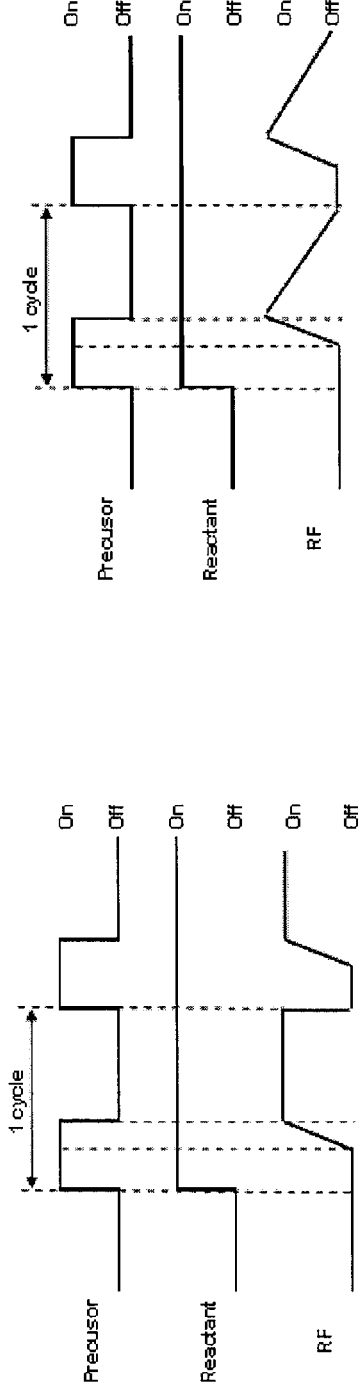
FIG.6E  FIG.6F  FIG.6G  FIG.6H

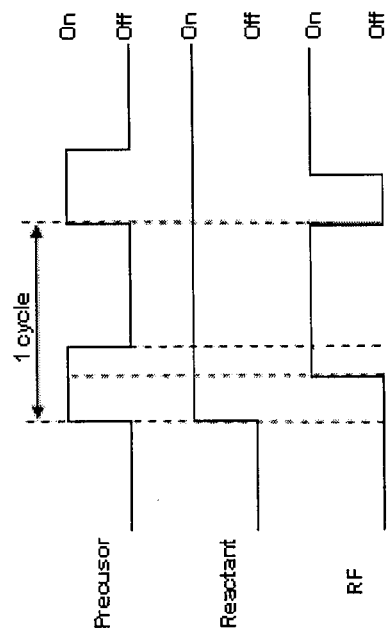
FIG.6I
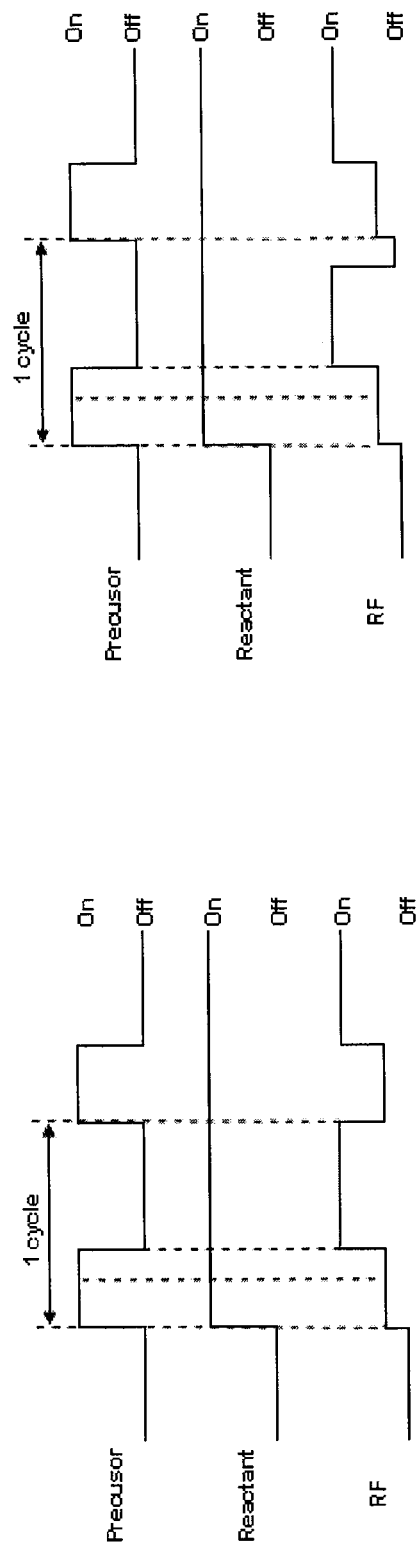
FIG.6K
FIG.6J

METHOD OF FORMING CONFORMAL FILM HAVING SI-N BONDS ON HIGH-ASPECT RATIO PATTERN

BACKGROUND

1. Field of the Invention

The present invention relates to semiconductor integrated circuit manufacturing and, more particularly to a method of forming a conformal dielectric film such as a silicon nitride film.

2. Description of the Related Art

Integrated circuits fabricated on semiconductor substrates for large scale integration require multiple levels of metal interconnections to electrically interconnect discrete layers of semiconductor devices formed on semiconductor chips. The different levels of interconnections are separated by various insulating or dielectric layers, which are etched to form via holes so as to connect one level of metal to another.

The evolution of chip design continually requires faster circuitry and greater circuit density than before. For faster circuits with greater circuit densities, certain properties are required of materials used to fabricate such integrated circuits, particularly as the dimensions of integrated circuit components are reduced to the sub-micron scale. Also, for greater integrated circuit densities, certain process sequences are required for the manufacture of integrated circuit components.

In recent years, silicon nitride layers deposited at low temperatures (less than 400° C) have been used in a number of important applications for memory devices, for example, as a passivation layer, a surface protection layer and/or a spacer for a transistor gate. Silicon nitride films may be formed by a plasma enhanced chemical vapor deposition (PECVD) method. The main advantages of the PECVD method over other CVD methods are higher deposition rates, and the controllability over a wide range of refractive indices. A further advantage of the PECVD method is that the process can take place at a relatively low temperature, for example temperatures under 400° C, keeping the total thermal budget of the cell processing to a minimum.

However, the PECVD method for forming silicon nitride leads to poor conformality or poor step coverage on a substrate containing small and/or high aspect ratio features. In small circuits and devices, such as ultra-large scale integrated (ULSI) circuitry, poor conformal coverage can hamper the development of higher density circuit devices and elements.

SUMMARY

An object of at least one embodiment of the present invention is to provide a method of forming a conformal dielectric film having Si—N bonds, such as a silicon nitride layer, on a substrate having a patterned surface with trenches, for example, for an integrated circuit.

In one embodiment of the invention, a method of forming a conformal dielectric film having Si—N bonds on a semiconductor substrate surface having a high aspect ratio pattern by pulsed plasma enhanced chemical gas deposition (PECVD) or plasma enhanced atomic layer deposition (PEALD) is provided. The method includes: (i) introducing a reactant gas into a reaction space inside which the substrate is placed; (ii) introducing a silicon precursor in pulses of less than 5-second duration into the reaction space, wherein one pulse and one following interval between pulses constitute one cycle of reaction; (iii) applying a first RF power to the reaction space during the pulse of the silicon precursor in each cycle; (iv) applying a second RF power to the reaction space during the interval of the silicon precursor pulse in each cycle, wherein an average intensity of the second RF power during the interval of the silicon precursor pulse is greater than that of the first RF power during the pulse of the silicon precursor; and (v) repeating the cycle to form a conformal dielectric film having Si—N bonds with a desired thickness on the patterned surface of the substrate. In this disclosure, the "gas" includes vaporized solid and/or liquid. Further, the "gas" refers to a single gas or a mixture of gases.

In some embodiments, RF plasma is generated by two-step application of RF power in pulses, while being synchronized with pulses of a silicon precursor. The first application takes place during the period of introducing the silicon precursor. In some embodiments, during the first application, RF plasma is generated after the introduction of the silicon precursor begins by delayed application of first RF power. In some embodiments, the intensity of the first RF power is low and/or the duration of the first RF power is short so as to decompose the precursor and make its molecules adsorb on the surface of the substrate, without increasing mobility and diffusivity of the molecules on the surface. The second application takes place during the period of introducing no silicon precursor. In some embodiments, during the second application, RF plasma is generated by applying second RF power at an intensity higher than that of the first RF power and/or for a period shorter than that of the first RF power so as to increase mobility and diffusivity of the molecules. In other words, in some embodiments, the first step of RF plasma is for generating and adsorbing molecules of silicon precursor on the surface, whereas the second step of RF plasma is for migrating the molecules on the surface, thereby improving the conformality or step coverage of a film.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

FIGS. 6A to 6K illustrate process steps of embodiments of the present invention for depositing a dielectric film.

DETAILED DESCRIPTION

Figure 1:
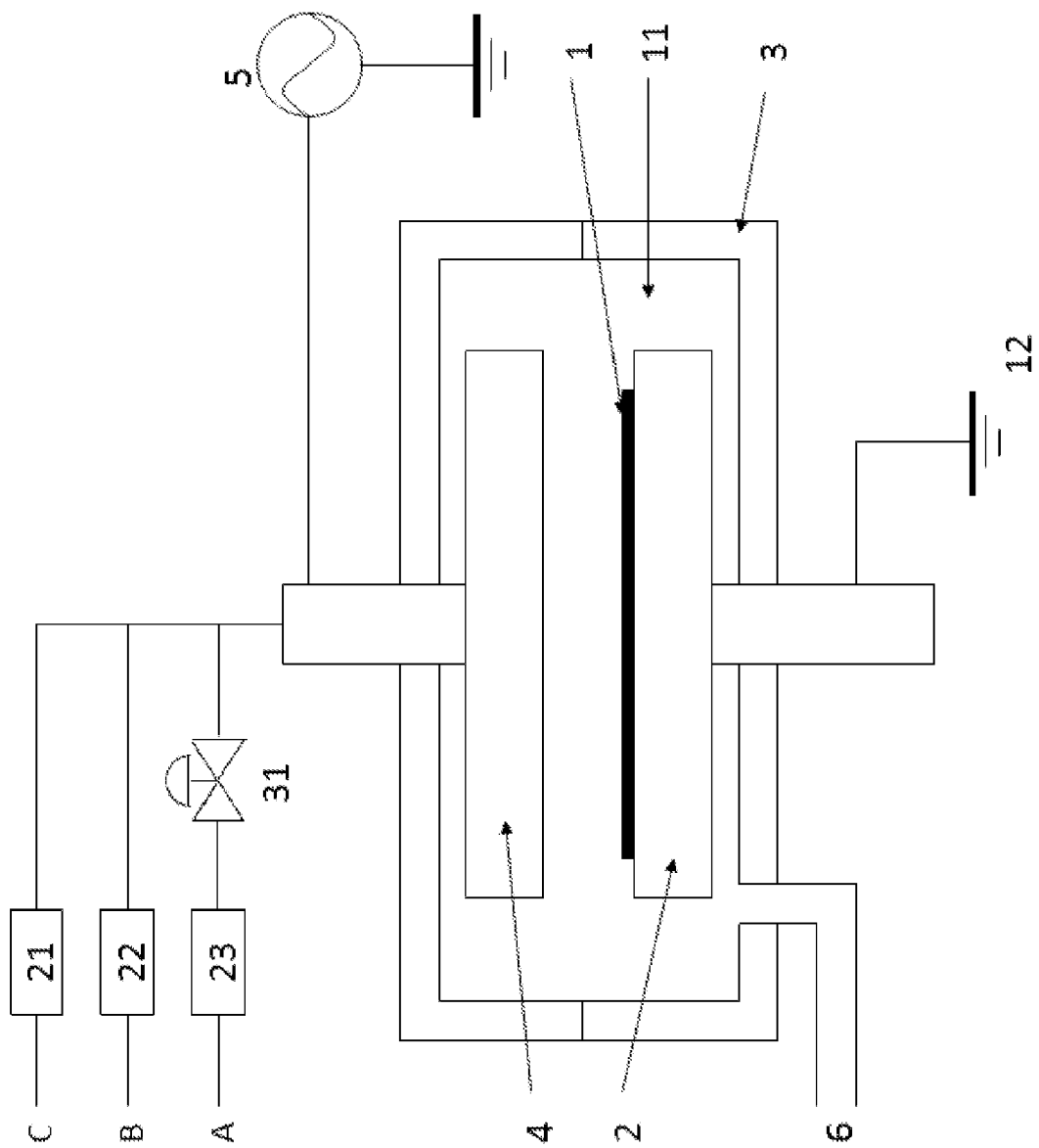
FIG. 1 is a schematic representation of a PECVD apparatus for depositing a silicon nitride film usable in one embodiment of the present invention.

The present invention is described with reference to embodiments which are not intended to limit the present invention. Additionally, an element applied in an embodiment may freely be applicable to other embodiments, and elements applied in different embodiments may mutually be replaceable or interchangeable unless special conditions are attached thereto. Further, the ranges indicated below may include or exclude the endpoints in embodiments.

As described above, the disclosed embodiments include a method of forming a conformal dielectric film having Si—N bonds on a substrate having a patterned surface, comprising: (i) introducing a reactant gas into a reaction space inside which the substrate is placed; (ii) introducing a silicon precursor in pulses of less than 5-second duration into the reaction space, wherein one pulse and one following interval between pulses constitute one cycle of reaction; (iii) applying a first RF power to the reaction space during the pulse of the silicon precursor in each cycle; (iv) applying a second RF power to the reaction space during the interval of the silicon precursor pulse in each cycle, wherein an average intensity of the second RF power during the interval of the silicon precursor pulse is greater than that of the first RF power during the pulse of the silicon precursor; and (v) repeating the cycle to form a conformal dielectric film having Si—N bonds with a desired thickness on the patterned surface of the substrate.

The step of applying the first RF power may also be referred to as an "adsorption step" or "first step" where the silicon precursor is supplied, and the step of applying the second RF power may also be referred to as an "migration step" or "second step" where the silicon precursor is not supplied.

In some embodiments, the average intensity of the first RF power is about 0.01 W/cm² to about 1 W/cm² (typically 0.02 W/cm² to 0.05 W/cm²) per area of the substrate during the pulse of the silicon precursor, and the average intensity of the second RF power is 0.02 W/cm² to about 5 W/cm² (typically 0.04 W/cm² to 0.1 W/cm²) per area of the substrate during the interval of the silicon precursor pulse.

Figure 5:
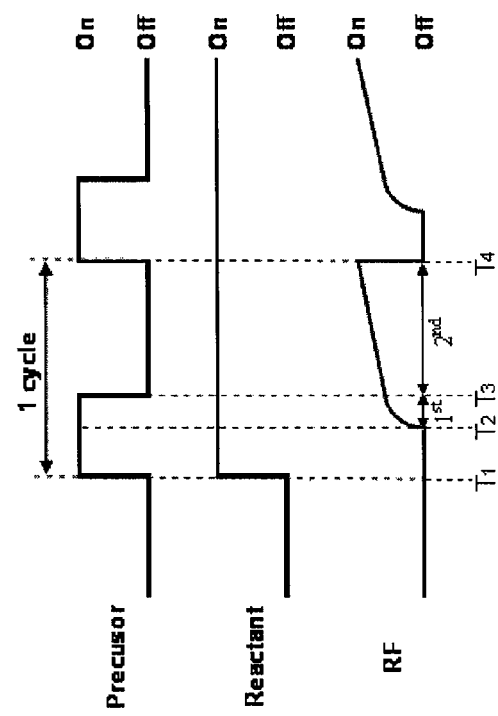
FIG. 5 illustrates process steps of an embodiment of the present invention for depositing a dielectric film.

In some embodiments, a highest intensity of the second RF power is higher than that of the first RF power as illustrated in FIGS. 5, 6A, 6B, 6C, 6D, 6E, 6F, 6J, and 6K, for example. In some embodiments, "higher" refers to at least 10%, 50%, 100%, 200%, 300%, 500%, or 1,000% higher than that of the first RF power (or any ranges defined by the forgoing numbers). In some embodiments, a highest intensity of the second RF power is equal to that of the first RF power as illustrated in FIGS. 6G, 6H, and 6I, for example. However, as described above, the average intensity of the second RF power during the interval of the silicon precursor pulse is greater than that of the first RF power during the pulse of the silicon precursor. The "average intensity" ($\overline{W}$) can be calculated by the equation:

$$\overline{W} = \frac{\int_{T1}^{T3} W dt}{T3 - T1}$$

wherein T1 is time at which the adsorption step begins, T3 is time at which the adsorption step ends, and W is wattage/h of the RF power which is a function of time (dt). FIG. 5 illustrates points of time T1, T2, T3, and T4 (T2 is time at which the application of the RF power begins, T4 is time at which the migration step ends). T3 is also time at which the migration step begins. This equation can be applied to other embodiments in the same manner.

Figure 6B:
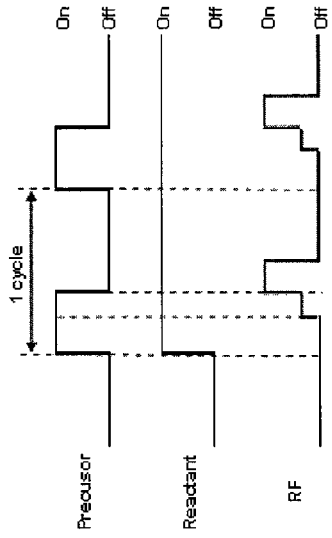
Figure 6D:
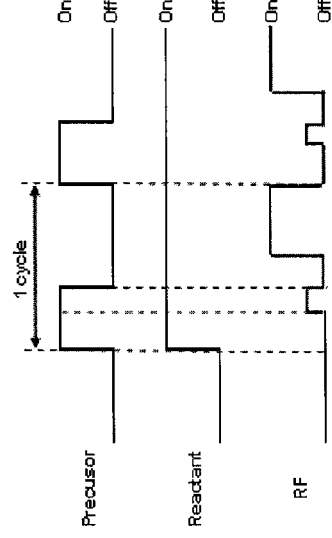
Figure 6A:
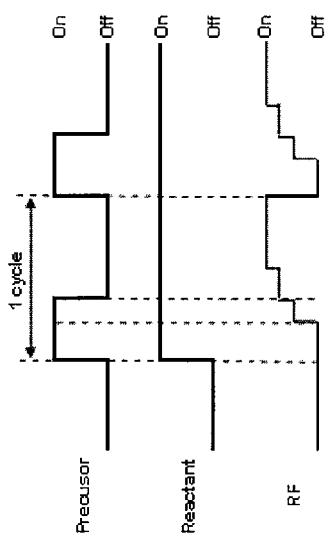
Figure 6C:
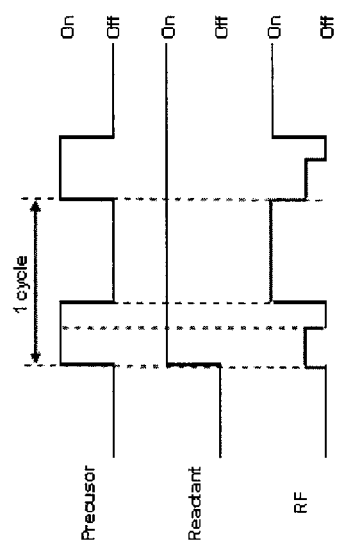

In some embodiments, an intensity of the first RF power changes from zero at a given ramp-up rate as illustrated in FIGS. 5, 6A, 6B, 6D, 6E, 6F, 6G, 6H, and 6I. In some embodiments, the application of the first RF power ends before the adsorption step is over as illustrated in FIG. 6C. In some embodiments, an intensity of the first RF power is constant throughout the adsorption step as illustrated in FIGS. 6J and 6K. In some embodiments, an intensity of the first RF power is constant when the first RF power is applied, although the time period of applying the first RF power is shorter than the time period of the entire adsorption step as illustrated in FIGS. 6B, 6C, 6D, 6F, and 6I. In some embodiments, an intensity of the first RF power changes in steps as illustrated in FIG. 6A. In some embodiments, an intensity of the first RF power increases with time at a constant rate as illustrated in FIGS. 6E, 6G, and 6H. In some embodiments, an intensity of the first RF power changes with time at a decreasing rate as illustrated in FIG. 5. Similarly, the second RF power can be applied as illustrated in FIGS. 5 and 6A to 6K. The second RF power can decrease with time during the migration step as illustrated in FIGS. 6F and 6H. The time period of applying the second RF power can be shorter than the time period of the entire migration step as illustrated in FIGS. 6B, 6D, and 6K. In some embodiments, the ramp-up rate or ramp-down rate may be 10 W/sec to 1,000 W/sec, typically 50 W/sec to 500 W/sec. Any combinations of the application patterns of the first RF power and the second RF power illustrated in FIGS. 5 and 6A to 6K (constant, decreasing or increasing at a constant rate, in steps, exponentially, or logarithmically, and continuous or intermittent) can be employed so as to effectively decompose the precursor and make its molecules adsorb on the surface of the substrate, without increasing mobility and diffusivity of the molecules on the surface in the adsorption step, and to effectively increase mobility and diffusivity of the molecules in the migration step, thereby improving the conformality or step coverage of a film depositing on the patterned surface, even if the patterned surface has a high aspect ratio.

In some embodiments, the patterned surface of the substrate has an aspect ratio of at least about 1.3, 1.5, 2, 2.5, 3, 5, or 10, or in any ranges defined by the foregoing. In some embodiments, the width of the recess may be in a range of about 40 nm to about 200 nm, typically about 60 nm to about 100 nm.

In some embodiments, the conformal film as deposited has a conformality of at least about 80%, 85%, 90%, or 95% or in any ranges defined by the foregoing. In some embodiments, the conformality may be over 90% even when the film is deposited on a patterned surface having an aspect ratio of about 1.5 or higher. The "conformality" or "step coverage" can be defined as the ratio percent of the average thickness of a layer deposited on a sidewall of a trench to the average thickness of a layer deposited on an upper surface of the substrate. In some embodiments, the conformality or step coverage can be defined as the ratio percent of the thinnest thickness of a layer deposited on a patterned surface to the thickest thickness of the layer.

In some embodiments, the first RF power and second RF power are both single-frequency RF power having the same frequency, such as 13.56 MHz, 27 MHz, or 60 MHz. In some embodiments, a combination of RF power having different frequencies (e.g., a combination of less than 2 MHz and higher than 5 MHz) can be used, and also, the first RF power and the second RF power can have different frequencies.

In some embodiments, the pressure of the reaction space is controlled at 700 Pa or lower (typically 200 to 500 Pa) during the pulse of the silicon precursor and during the interval of the silicon precursor pulse.

In some embodiments, a second precursor is supplied together with the silicon precursor. The second precursor includes a hydrocarbon gas such as hexane so that the resultant film is doped with carbon. Other hydrocarbon gases such as pentane and octane each can be used in place of hexane, or in any combination. In the disclosure, in some embodiments, the "precursor" refers to a mixture of the silicon precursor and the hydrocarbon precursor.

In some embodiments, the silicon precursor has a formula of $Si_\alpha H_\beta X_\gamma$, wherein $\alpha$, $\beta$ and $\gamma$ are integers ($\gamma$ includes zero), wherein X comprises N and/or Cl. In an embodiment, $\alpha$ may be 1 to 5, $\beta$ may be 1 to 10, and $\gamma$ may be 0 to 6. In an embodiment, m may be 2 to 18, and n may be 6 to 30. In some embodiments, the silicon precursor is selected from the group consisting of $N(SiH_3)_3$, $SiH_4$, $Si[N(C_2H_5)_2]_2H_2$, $Si[N(CH_3)_2]_3H$, $[(CH_3)_2N]_3SiCl$, $Si[N(CH_3)(C_2H_5)]_3H$, $Si_2[NH(C_2H_5)_6]$, and $SiH_2[N(C_2H_5)_2]$.

In some embodiments, the reactant gas comprises at least one of a mixture of $N_2$ and $H_2$ and a mixture of $NH_3$ and $H_2$. In some embodiments, a mixture of $N_2$ and $H_2$ with a molar flow rate ratio of $N_2/H_2$ of approximately 10/1 to 1/10 is used. If the silicon precursor contains nitrogen, a molar flow rate ratio of $N_2/H_2$ may be approximately 1/10 to 0. In some embodiments, a mixture of $NH_3$ and $H_2$ (which is also referred to as $N_2/H_2$ reactant gas) has a molar flow rate ratio similar to that of $N_2/H_2$.

In some embodiments, the reactant further comprises a rare gas, wherein the reactant gas including the rare gas is continuously introduced to the reaction space so that the flow of the reactant gas including the rare gas function as a purge gas during the intervals of the silicon precursor pulses. In some embodiments, the $N_2/H_2$ reactant gas can be supplied in pulses, whereas the rare gas is supplied continuously. In some embodiments, the rare gas may be one or more gases selected from the group consisting of He, Ar, Kr, and Xe, and the molar flow rate of the rare gas may be greater than the molar flow rate of the silicon source. In some embodiments, the rare gas comprises a mixture of helium and argon (in some embodiments the molar flow rate ratio of helium/argon is about 5/1 to about 1/5).

In some embodiments, a flow rate of each of the $N_2/H_2$ reactant gas and the rare gas introduced into the reaction chamber may be approximately 30 sccm to 3000 sccm. In some embodiments the flow rate of each of the $N_2/H_2$ reactant gas and the rare gas is about 1500 sccm to about 2500 sccm. In some embodiments, a rare gas is supplied, but no $N_2/H_2$ reactant gas is supplied. The silicon precursor and the hydrocarbon precursor may be supplied at a flow rate similar to the above. However, in some embodiments, the precursor is saturated on the surface for adsorption, and thus, higher flow rates do not necessarily lead to a thicker film.

In some embodiments, only the three types of gas (i.e., the silicon precursor, $N_2/H_2$ reactant gas, and rare gas) may be used for a SiN film, only the four types of gas (i.e., the silicon precursor, hydrocarbon precursor, $N_2/H_2$ reactant gas, and rare gas) may be used for a SiCN film, and no other gases such as a carbon precursor may be used.

In some embodiments, the pulse duration is equal to or shorter than the interval between pulses. Further, in some embodiments, the silicon precursor is introduced in pulses of a duration of about 0.1 sec to about 1.0 sec with an interval between pulses of about 0.1 sec to about 3.0 sec. In some embodiments, the pulse duration of the silicon precursor is at least about 0.1 sec but less than about 5.0 sec, less than about 3.0 sec, or less than about 1.0 sec, whereas the length of the interval is at least about 0.1 sec, at least about 0.5 sec, at least about 1.0 sec, but less than about 10 sec, less than about 5.0 sec, or less than about 3.0 sec.

In some embodiments, the conformal dielectric film is a SiN film or SiCN film.

In some embodiments, the steps of introducing the silicon precursor, introducing the reactant gas, applying the RF power, and repeating the cycle are controlled as pulsed plasma enhanced chemical vapor deposition or plasma enhanced atomic layer deposition.

In some embodiments, the substrate may be kept at a temperature of 0° C to 550° C while the film is deposited thereon. In some embodiments the substrate temperature is about 250° C to about 400° C during deposition.

In some embodiments, deposition conditions may include the following:

Precursor:
Trisilylamine: 10-2000 sccm (typically 1000 to 2000 sccm)
Hexane: 0-2000 sccm (typically 1000 to 2000 sccm)
Supply time: 0.1-5 sec (typically 0.1 to 1 sec)
Reactant:
Hydrogen: 0-2000 sccm (typically 500 to 1000 sccm)
Nitrogen: 0-2000 sccm (typically 500 to 1000 sccm)
Ammonia: 0-2000 sccm (typically 0 to 800 sccm)
Process helium: 0-2000 sccm (typically 800 to 1500 sccm)
Sealed helium: 200-600 sccm (typically 300 to 500 sccm)
Argon: 100-2000 sccm (typically 800 to 1500 sccm)
RC Condition:
Pressure: 200-700 Pa (typically 250 to 400 Pa)
Substrate temperature: 100-500° C (typically 300 to 400° C)

In some embodiments, the dielectric constant of the conformal dielectric film may be in the range of 4.5 to 7.5. In some embodiments the dielectric constant is about 6.5 to about 7.2.

Embodiments are explained with reference to the drawings which are not intended to limit the present invention. FIG. 1 is a schematic view of an apparatus combining a plasma CVD reactor and flow control valves, desirably in conjunction with controls programmed to conduct the sequences described below, which can be used in an embodiment of the present invention.

In this example, by providing a pair of electrically conductive flat-plate electrodes 4, 2 in parallel and facing each other in the interior 11 of a reaction chamber 3, applying RF power 5 to one side, and electrically grounding 12 the other side, a plasma is excited between the electrodes. A temperature regulator is provided in a lower stage (which also serves as the lower electrode 2), and a temperature of a substrate 1 placed thereon is kept constant at a given temperature. The upper electrode 4 serves as a shower plate as well, and the reactant gas (C) and additive gas or hydrocarbon precursor (B) are introduced into the reaction chamber 3 through gas flow controllers 21, 22, respectively, and the shower plate. Also the silicon precursor (A) is introduced into the reaction chamber 3 through a gas controller 23, a pulse flow control valve 31, and the shower plate. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3. A separation plate for separating a reaction zone and a transfer zone in the interior of the reaction chamber is omitted from this schematic figure. The seal gas is not required but is used in some embodiments for aiding in preventing reaction gas from communicating with the lower part of the chamber below the separation plate.

For the pulse flow control valve 31, a pulse supply valve that is used for ALD (atomic layer deposition) can be used in some embodiments.

In the above, the pulsing of the RF power can be accomplished by adjusting a matching box (not shown). The RF power requires a minimum time period for discharging, which is typically as short as 8 msec. Thus, by adjusting the matching box, the duration of the RF power can easily be controlled at about 0.1 sec, for example.

In some embodiments, the average thickness deposited per cycle may be about 0.6 nm/cycle to about 1.0 nm/cycle. The pulse supply of the silicon precursor can be continued until a desired thickness of film is obtained. If the desired thickness of film is 20 nm to 100 nm, about 20 cycles to about 150 cycles (e.g., 40 to 100 cycles) may be conducted.

The embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE

Example 1

Figure 3:
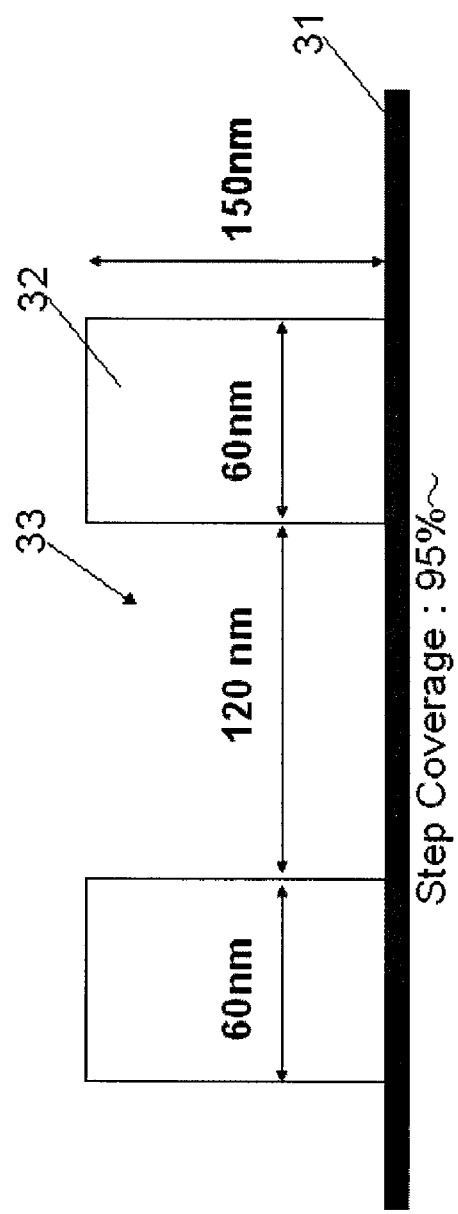
FIG. 3 is a schematic cross sectional view of a patterned surface having an aspect ratio of 1.25, where the conformality or step coverage of a film would be 95% or higher according to the comparative PECVD method illustrated in FIG. 2.
Figure 4:
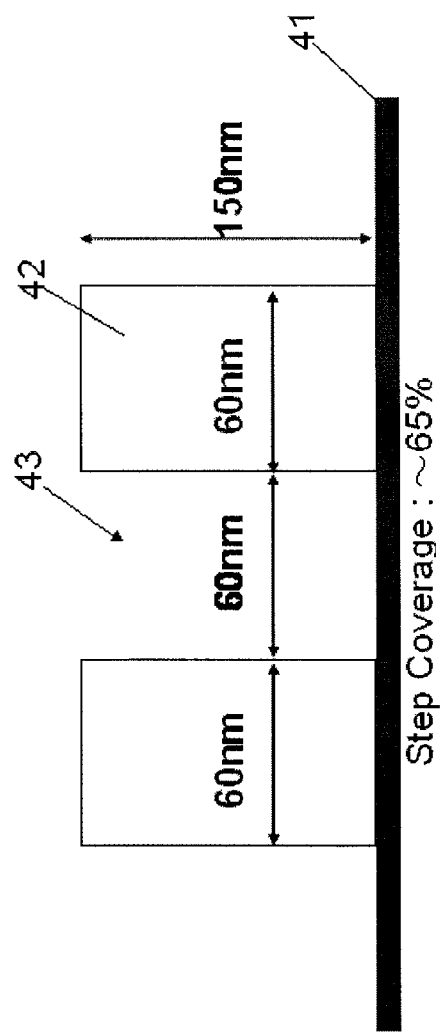
FIG. 4 is a schematic cross sectional view of a patterned surface having an aspect ratio of 2.5, where the conformality or step coverage of a film would be 65% or less according to the comparative PECVD method illustrated in FIG. 2.

A SiCN layer was formed on a substrate having trenches under the conditions shown below using the sequence illustrated in FIG. 5 and the PECVD apparatus illustrated in FIG. 1. The trenches included relatively wide trenches with an aspect ratio of 1.25 (a width of 120 nm and a depth of 150 nm as shown in FIG. 3 wherein trenches 33 are formed between an etched low-k layer 32 on a substrate 31), intermediate trenches with an aspect ratio of 2.0 (a width of 75 nm and a depth of 150 nm), and relatively narrow trenches 43 with an aspect ratio of 2.5 (a width of 60 nm and a depth of 150 nm as shown in FIG. 4 wherein trenches 43 are formed between an etched low-k layer 42 on a substrate 41). Thus trenches of different aspect ratios were coated.
Trisilylamine: 2000 sccm
Hexane: 2000 sccm
Hydrogen: 1000 sccm
Nitrogen: 100 sccm
Process helium: 1400 sccm
Sealed helium: 500 sccm
Argon: 1000 sccm
Substrate temperature: 400° C
Pressure: 300 Pa
Precursor (Trisilylamine and Hexane) supply time: 0.5 sec supply, 2 sec supply stop
RF power (a frequency of 13.56 MHz):
RF first ramp-up time: 0.1 sec (0→18 W), beginning at a point of 0.4 sec ($\overline{W}$=2.7 W)
RF second ramp-up time: 2 sec (18→23 W) ($\overline{W}$=20.5 W)

After completion of the deposition (500 cycles), the trenches were observed with a scanning electron microscope (SEM) and the conformality was determined.

Comparative Example 1

Figure 2:
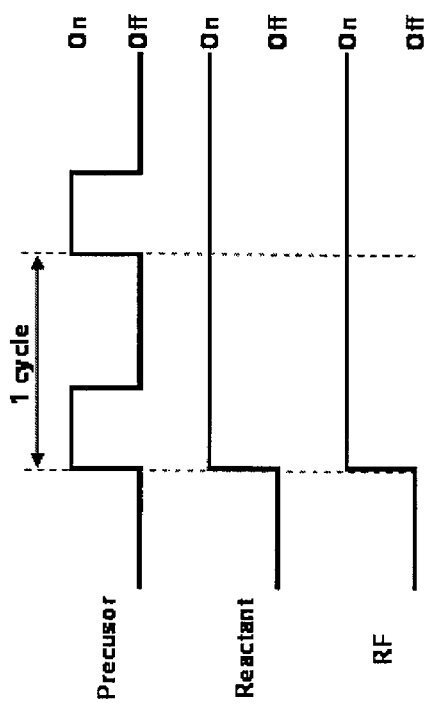
FIG. 2 illustrates process steps of a comparative PECVD method for depositing a dielectric film.

Under the same conditions as in Example 1, except for the application pattern of the RF power, a SiCN layer was formed on the substrate. The application pattern of the RF power was shown in FIG. 2, wherein the RF power was constantly 25 W and continuously applied. After completion of the deposition, the trenches were observed with a scanning electron microscope (SEM) and the conformality was determined.

The results are shown in Table 1 below.

TABLE 1

|  | Conformality | | |
| --- | --- | --- | --- |
| Aspect ratio | 1.25 | 2.0 | 2.5 |
| Comparative Example 1 | 95% | 80% | 65% |
| Example 1 | 95% | 95% | 95% |

As shown in Table 1, in Example 1, when the RF power was applied in two steps wherein a higher intensity of RF power was applied when the precursor was not supplied in the second step (the migration step) than in the first step (the adsorption step), the conformality of the SiCN film was surprisingly high regardless of the aspect ratio. The conformality was 95% not only when the aspect ratio was 1.25, but also when the aspect ratios were 2.0 and 2.5. In contrast, in Comparative Example 1, when the RF power was applied constantly and continuously throughout the entire cycles, the conformality of the SiCN film was good only when the aspect ratio was 1.25. The conformality progressively degraded when the aspect ratio became higher, and when the aspect ratio was 2.5, the conformality became as low as 65%.

Example 3

Under the same conditions as in Example 1, except for the pressure, a SiCN layer was formed on the substrate with the trenches having an aspect ratio of 2.5. The pressure was 600 Pa. After completion of the deposition, the trenches were observed with a scanning electron microscope (SEM) and the conformality was determined.

The results are shown in Table 2 below.

TABLE 2

|  | Conformality | |
| --- | --- | --- |
| Pressure (Pa) | 300 (Example 1) | 600 (Example 3) |
| Conformality | 95% | 89% |

As shown in Table 2, in Example 3, when the pressure was higher (Example 3), the conformality was not as good as that when the pressure was low (Example 1). However, the conformality in Example 3 was significantly superior to that in Comparative Example 1 since the RF power was applied in two steps as in Example 1.

A significant advantage of the method of at least one of the disclosed embodiments of the present invention is that highly-conformal silicon nitride layers or other Si—N dielectric layers can be formed on various types of substrates.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming a conformal dielectric film having Si—N bonds on a substrate having a patterned surface, comprising:
    introducing a reactant gas into a reaction space inside which the substrate is placed;
    introducing a silicon precursor in pulses of less than 5-second duration into the reaction space, wherein one pulse of the silicon precursor and one immediately following interval devoid of the silicon precursor, which interval is between the one pulse and one next pulse of the silicon precursor, constitute one cycle of reaction;
    applying a first RF power to the reaction space during the pulse of the silicon precursor in each cycle;
    applying a second RF power to the reaction space during the interval of the silicon precursor pulse in each cycle, wherein an average intensity of the second RF power during the interval of the silicon precursor pulse is greater than that of the first RF power during the pulse of the silicon precursor in each cycle; and
    repeating the cycle to form a conformal dielectric film having Si—N bonds with a desired thickness on the patterned surface of the substrate.

2. The method according to claim 1, wherein a highest intensity of the second RF power is higher than that of the first RF power.

3. The method according to claim 1, wherein an intensity of the first RF power changes from zero at a given ramp-up rate.

4. The method according to claim 1, wherein the first RF power and second RF power are both single-frequency RF power having the same frequency.

5. The method according to claim 1, wherein the average intensity of the first RF power is about 0.01 W/cm$^2$ to about 1 W/cm$^2$ per area of the substrate during the pulse of the silicon precursor, and the average intensity of the second RF power is 0.02 W/cm$^2$ to about 5 W/cm$^2$ per area of the substrate during the interval of the silicon precursor pulse.

6. The method according to claim 1, wherein the patterned surface of the substrate has an aspect ratio of about 1.5 or higher.

7. The method according to claim 1, wherein the conformal film has a conformality of about 90% or higher.

8. The method according to claim 1, wherein the pressure of the reaction space is controlled at 500 Pa or lower during the pulse of the silicon precursor and during the interval of the silicon precursor pulse.

9. The method according to claim 1, further comprising introducing a hydrocarbon gas by synchronizing its flow with the pulses of the silicon precursor.

10. The method according to claim 9, wherein the hydrocarbon gas is hexane.

11. The method according to claim 1, wherein the silicon precursor has a formula of $Si_\alpha H_\beta X_\gamma$, wherein $\alpha$, $\beta$ and $\gamma$ are integers ($\gamma$ includes zero), wherein X comprises N and/or Cl.

12. The method according to claim 11, wherein the silicon precursor is selected from the group consisting of $N(SiH_3)_3$, $SiH_4$, $Si[N(C_2H_5)_2]_2H_2$, $Si[N(CH_3)_2]_3H$, $[(CH_3)_2N]_3SiCl$, $Si[N(CH_3)(C_2H_5)]_3H$, $Si_2[NH(C_2H_5)_6]$, and $SiH_2[N(C_2H_5)_2]$.

13. The method according to claim 1 wherein the reactant gas comprises a rare gas which is continuously introduced to the reaction space.

14. The method according to claim 1, wherein the pulse duration is equal to or shorter than the interval between pulses.

15. The method according to claim 14, wherein the silicon precursor is introduced in pulses of a duration of about 0.1 sec to about 1.0 sec with an interval between pulses of about 0.1 sec to about 3.0 sec.

16. The method according to claim 1, wherein the reactant gas comprises at least one of a mixture of $N_2$ and $H_2$ and a mixture of $NH_3$ and $H_2$ which is continuously introduced to the reaction space.

17. The method according to claim 13, wherein the rare gas comprises a mixture of helium and argon.

18. The method according to claim 1, wherein the conformal dielectric film is a SiN film or SICN.

19. The method according to claim 1, wherein the steps of introducing the silicon precursor, introducing the reactant gas, applying the RF power, and repeating the cycle are controlled as pulsed plasma enhanced chemical vapor deposition or plasma enhanced atomic layer deposition.

* * * * *